US012628634B2

(12) United States Patent
Xie et al.

(10) Patent No.: US 12,628,634 B2
(45) Date of Patent: May 12, 2026

(54) VIA RESISTANCE REDUCTION

(71) Applicant: International Business Machines Corporation, Armonk, NY (US)

(72) Inventors: Ruilong Xie, Niskayuna, NY (US); Nicholas Anthony Lanzillo, Wynantskill, NY (US); Brent A Anderson, Jericho, VT (US); Reinaldo Vega, Mahopac, NY (US); Albert M. Chu, Nashua, NH (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 482 days.

(21) Appl. No.: 17/880,359

(22) Filed: Aug. 3, 2022

(65) Prior Publication Data

US 2024/0047341 A1     Feb. 8, 2024

(51) Int. Cl.
| | |
|---|---|
| *H10W 20/42* | (2026.01) |
| *H10W 20/00* | (2026.01) |
| *H10W 20/41* | (2026.01) |

(52) U.S. Cl.
CPC ......... *H10W 20/42* (2026.01); *H10W 20/056* (2026.01); *H10W 20/089* (2026.01); *H10W 20/435* (2026.01)

(58) Field of Classification Search
CPC ........... H01L 23/5226; H01L 21/76816; H01L 21/76877; H01L 21/76831; H01L 21/76808; H01L 21/76897; H10W 20/42; H10W 20/435; H10W 20/056; H10W 20/069; H10W 20/0693; H10W 20/077; H10W 20/076; H10W 20/085
See application file for complete search history.

(56) References Cited

U.S. PATENT DOCUMENTS

| | | | | |
|---|---|---|---|---|
| 6,462,395 | B1 * | 10/2002 | Fukuda | ............. H01L 21/76816 |
| | | | | 257/E21.59 |
| 6,784,102 | B2 * | 8/2004 | Yeung | ................. H01L 23/5226 |
| | | | | 438/584 |
| 7,078,817 | B2 | 7/2006 | Ho et al. | |
| 9,324,650 | B2 | 4/2016 | Edelstein et al. | |
| 9,391,020 | B2 | 7/2016 | Zhang et al. | |
| 9,595,465 | B2 | 3/2017 | Melzner | |
| 9,905,509 | B2 * | 2/2018 | Chen | ................... H01L 23/5226 |

(Continued)

FOREIGN PATENT DOCUMENTS

WO      WO2015094501 A1      6/2015

OTHER PUBLICATIONS

Ciofi et al., "Modeling of Via Resistance for Advanced Technology Nodes," IEEE Transactions on Electron Devices (Apr. 2017) (17 pages).

*Primary Examiner* — Bac H Au

(74) *Attorney, Agent, or Firm* — Samuel A. Waldbaum

(57)                ABSTRACT

Interconnect designs with reduced via resistance are provided. In one aspect, an interconnect structure includes: at least a first metal line and a second metal line; and a conductive via in between the first metal line and the second metal line, wherein the conductive via has elongated dimensions along a major axis of the first metal line and along a major axis of the second metal line. Dielectric caps can be present on the first metal lines, and below and above the second metal lines. A method of forming the present interconnect structure is also provided.

11 Claims, 17 Drawing Sheets

(56)                        References Cited

U.S. PATENT DOCUMENTS

|   |   |   |   |   |
|---|---|---|---|---|
| 9,966,337 | B1 | 5/2018 | Briggs et al. | |
| 10,177,028 | B1 | 1/2019 | LiCausi et al. | |
| 10,354,912 | B2 * | 7/2019 | Xu | H01L 21/76832 |
| 10,629,484 | B1 * | 4/2020 | Parikh | H01L 21/76897 |
| 11,011,485 | B2 * | 5/2021 | Choi | H01L 23/49838 |
| 11,527,433 | B2 * | 12/2022 | Guler | H01L 21/76834 |
| 2015/0364420 | A1 * | 12/2015 | Lin | H01L 23/485 |
| | | | | 438/668 |
| 2016/0027729 | A1 * | 1/2016 | Chen | H01L 23/5226 |
| | | | | 438/702 |
| 2018/0315654 | A1 | 11/2018 | Briggs et al. | |
| 2021/0091190 | A1 * | 3/2021 | Huang | H10D 30/024 |
| 2021/0183699 | A1 | 6/2021 | Murray et al. | |
| 2021/0280456 | A1 * | 9/2021 | Huang | H01L 21/76897 |
| 2021/0313222 | A1 * | 10/2021 | Guler | H01L 21/76897 |
| 2021/0320061 | A1 * | 10/2021 | Huang | H10D 84/0149 |
| 2023/0163024 | A1 * | 5/2023 | Majhi | H01L 23/5226 |
| | | | | 257/774 |
| 2024/0038656 | A1 * | 2/2024 | Xie | H01L 21/76808 |
| 2025/0125253 | A1 * | 4/2025 | Oh | H01L 23/5226 |

* cited by examiner

X-X'

Y-Y'

502

402

102    Mx-1

302

X-X'

502

402

102

304    Mx-1    Mx-1    Mx-1

302

Y-Y'

604

602
502
702
402
102    Mx-1
302

X-X'

702
502
402
102
304    Mx-1    Mx-1    Mx-1
302

Y-Y'

Y-Y'

106

502

702

104

402

102

302

Mx

Mx

Mx

Vx-1

Mx-1

Minor axis *b2*

Elongated dimension
(Horizontal region I)

Major axis *a1*

X-X'

VIA RESISTANCE REDUCTION

FIELD OF THE INVENTION

The present invention relates to interconnect structures, and more particularly, to interconnect designs with reduced via resistance, and techniques for fabrication thereof by locally increasing the via size.

BACKGROUND OF THE INVENTION

In a semiconductor integrated circuit back end of line (BEOL) production flow, individual devices such as transistors, diodes, capacitors, resistors, etc. get interconnected through a series of metal layers. For instance, conductive structures like vias and metal lines can be employed to connect a device to one or more other devices, with the metal lines making lateral connections and the vias making vertical connections amongst different metallization levels.

However, at scaled dimensions, reducing the BEOL pitch means that the via size gets increasingly smaller, thereby creating a resistance bottle neck for advanced designs. Namely, there is a point beyond which conventional interconnects cannot be scaled without incurring an unacceptable tradeoff in device performance.

Therefore, scalable interconnect designs that avoid this via resistance bottle neck would be desirable.

SUMMARY OF THE INVENTION

The present invention provides improved interconnect designs with reduced via resistance, and techniques for fabrication thereof by locally increasing the via size. In one aspect of the invention, an interconnect structure is provided. The interconnect structure includes: at least a first metal line and a second metal line; and a conductive via in between the first metal line and the second metal line, wherein the conductive via has elongated dimensions along a major axis of the first metal line and along a major axis of the second metal line.

In another aspect of the invention, another interconnect structure is provided. The interconnect structure includes: first metal lines; first dielectric caps on the first metal lines; a conductive via disposed directly on a given one of the first metal lines; second metal lines over the first metal lines with a given one of the second metal lines disposed directly on the conductive via, wherein the conductive via has elongated dimensions along a major axis of the given first metal line and along a major axis of the given second metal line; second dielectric caps present below the second metal lines; and third dielectric caps present above the second metal lines.

In yet another aspect of the invention, a method of forming an interconnect structure is provided. The method includes: forming first metal lines and first dielectric caps on the first metal lines embedded in a first interlayer dielectric; depositing a second interlayer dielectric onto the first interlayer dielectric over the first metal lines and the first dielectric caps; forming trenches in the second interlayer dielectric; forming second dielectric caps at bottoms of the trenches; patterning a via through a given one of the second dielectric caps, the second interlayer dielectric, and a given one of the first dielectric caps over a given one of the first metal lines; laterally recessing the given first dielectric cap and the given second dielectric cap through the via to locally elongate the dimensions of the via; and forming a conductive via in the via and second metal lines in the trenches with a given one of the second metal lines over the conductive via, wherein the conductive via has elongated dimensions along a major axis of the given first metal line and along a major axis of the given second metal line.

A more complete understanding of the present invention, as well as further features and advantages of the present invention, will be obtained by reference to the following detailed description and drawings.

DETAILED DESCRIPTION OF PREFERRED EMBODIMENTS

As highlighted above, a reduction in back end of line (BEOL) pitch means that the dimensions of interconnect features such as conductive vias are greatly reduced. With conventional interconnect designs, this can create a resistance bottle neck for advanced technology nodes.

Figure 1:
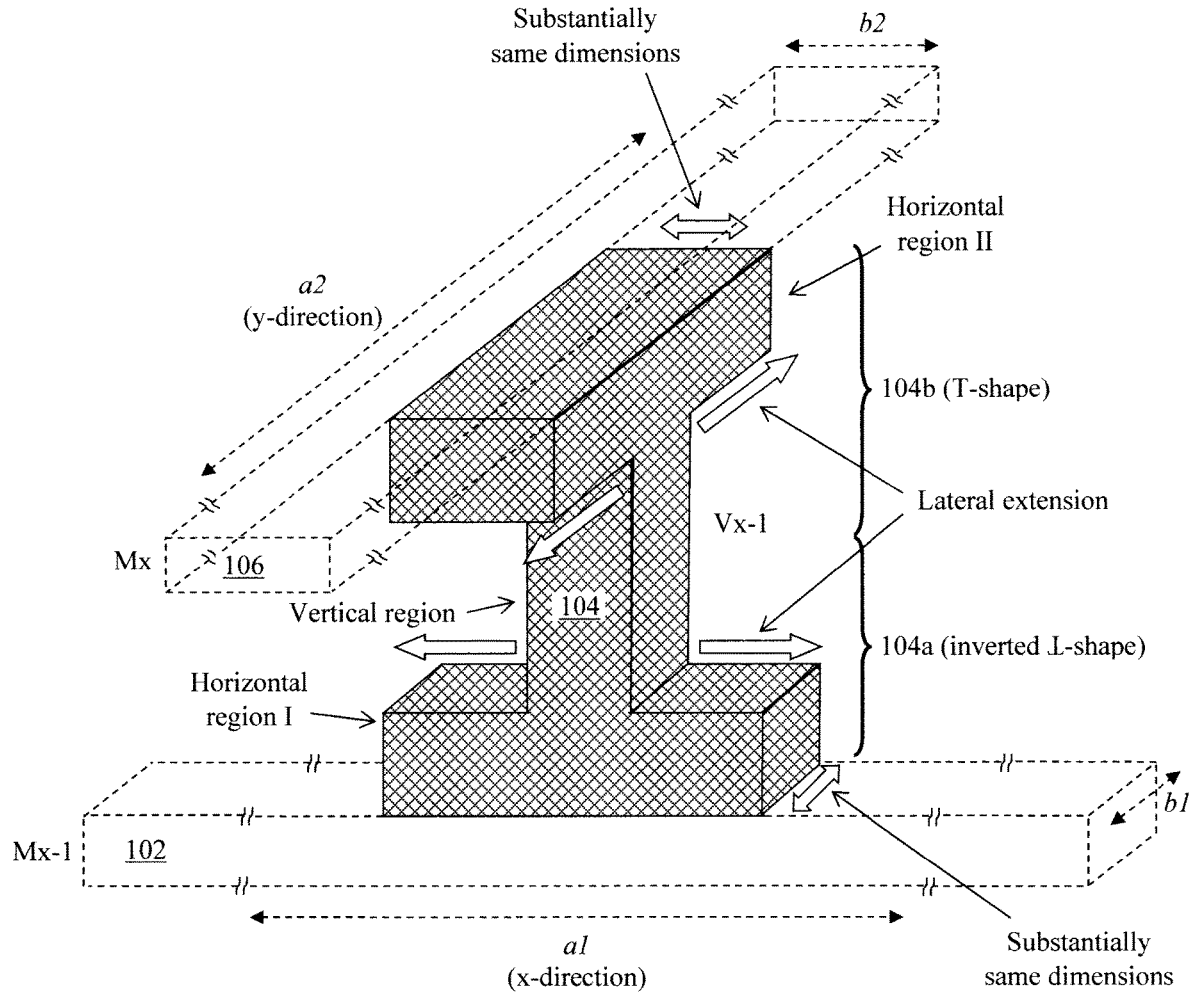
FIG. 1 is a schematic diagram of the present interconnect structure where the conductive via size has been increased locally according to an embodiment of the present invention.

Advantageously, provided herein are techniques for locally increasing the via size, and thereby reducing the overall via resistance, effectively removing the resistance bottle neck. As will be described in detail below, the present interconnect designs include a conductive via having elongated dimensions along both a first direction and a second direction. For instance, referring briefly to FIG. 1, a schematic diagram of an interconnect structure formed in accordance with the present techniques is shown. In order to illustrate the unique shape of the present locally-elongated via design, only the conductive via 104 (Vx-1) and one of each of the first/second metal lines 102 (Mx-1) and 106 (Mx), below and above the conductive via 104, are shown in FIG. 1. Namely, as will become apparent from the description that follows, there are interlayer dielectrics surrounding the conductive via 104 and dielectric caps below and/or above the first/second metal lines 102. However, these components are not shown in FIG. 1. Further, the first/second metal lines 102 and 106 are depicted using dashed lines in order to clarify the configuration of the (locally-elongated) conductive via 104. It is notable that the various structures shown throughout the figures may not be drawn to scale.

As shown in FIG. 1, conductive via 104 is present in between first metal line 102 and second metal line 106. According to an exemplary embodiment, conductive via 104 is in direct physical contact with both first metal line 102 and second metal line 106. As will be described in detail below, in one embodiment, conductive via 104 is formed from a same metal or combination of metals as the first metal line 102 and/or the second metal line 106. That is however not a requirement, and embodiments are also contemplated herein where the metal(s) used to form conductive via 104 is/are different from those used to form the first metal line 102 and/or the second metal line 106.

Conductive via 104 has a unique configuration where a bottom portion 104a and a top portion 104b of conductive via 104 each have a T-shape (an inverted T-shape in the case of the bottom portion 104a). However, the horizontal regions of the bottom portion 104a and the top portion 104b, where conductive via 104 is locally elongated, extend laterally along different directions. For instance, as shown in FIG. 1, the horizontal regions of the (inverted T-shape) bottom portion 104a extend laterally along a (first) x-direction. As will be described in detail below, this first/x-direction is along a major axis of the first metal line 102. By contrast, the horizontal regions of the (T-shape) top portion 104b extend laterally along a (second) y-direction. As will be described in detail below, this second/y-direction is along a major axis of the second metal line 106.

To look at it another way, with this unique design, conductive via 104 has (first/second) horizontal regions, Horizontal region I and Horizontal region II, that extend laterally along the major axes of first metal line 102 and second metal line 106 respectively, and a Vertical region in between (and directly contacting) Horizontal region I and Horizontal region II. See FIG. 1. Notably, Horizontal region I and Horizontal region II each extends laterally (Lateral extension) beyond the Vertical region along the major axes of first metal line 102 and second metal line 106 respectively. By locally increasing the size of these Horizontal regions I and II (as compared to conventional interconnect via designs which consist primarily of a monolithic vertical structure), there is an increase in the amount of conductive material (e.g., metal) in the present conductive via 104 which advantageously decreases the overall via resistance. As such, the present conductive via 104 design is well suited for advanced interconnect scaling.

According to an exemplary embodiment, the first metal line 102 and the second metal line 106 are oriented orthogonal to one another. In that case, the (first) x-direction and the (second) y-direction are also orthogonal to one another, as are the Lateral extensions of the bottom portion 104a and the top portion 104b of conductive via 104. For instance, referring to the example depicted in FIG. 1, Horizontal region I would be oriented orthogonal to Horizontal region II. It is notable that an orthogonal orientation is merely one example. However, in most implementations, the Lateral extensions of the bottom portion 104a and the top portion 104b of conductive via 104, i.e., Horizontal region I and Horizontal region II respectively, extend in different directions, whether they be orthogonal or otherwise.

As also shown in FIG. 1, first metal line 102 has a major axis a1 (along a length of first metal line 102) and a minor axis b1 (along a width of first metal line 102). Likewise, second metal line 106 has a major axis a2 (along a length of second metal line 106) and a minor axis b2 (along a width of second metal line 106). The major and minor axes a1/a2 and b1/b2 of first metal line 102 and second metal line 106 are illustrated to highlight another unique feature of the present interconnect design. Namely, as provided above, conductive via 104 has elongated dimensions, i.e., Lateral extensions of Horizontal region I and Horizontal region II, along the major axes a1 and a2 of first metal line 102 and second metal line 106 respectively. However, as will become apparent from the description that follows, conductive via 104 has substantially the same dimensions as the first metal line 102 and second metal line 106 along the minor axes b1 and b2 of the first metal line 102 and second metal line 106. For instance, referring to FIG. 1, Horizontal region I of bottom portion 104*a* of conductive via 104 has substantially the same dimension as first metal line 102 along the minor axis b1 of first metal line 102. In the same manner, Horizontal region II of top portion 104*b* of conductive via 104 has substantially the same dimension as second metal line 106 along the minor axis b2 of second metal line 106. According to an exemplary embodiment, by 'substantially the same' it is meant that the dimension of the Horizontal region I/Horizontal region II of conductive via 104 differs from the dimension along the minor axis b1/minor axis b2 of first metal line 102/second metal line 106, respectively, by less than or equal to about 2 nanometers (nm).

Figure 2:
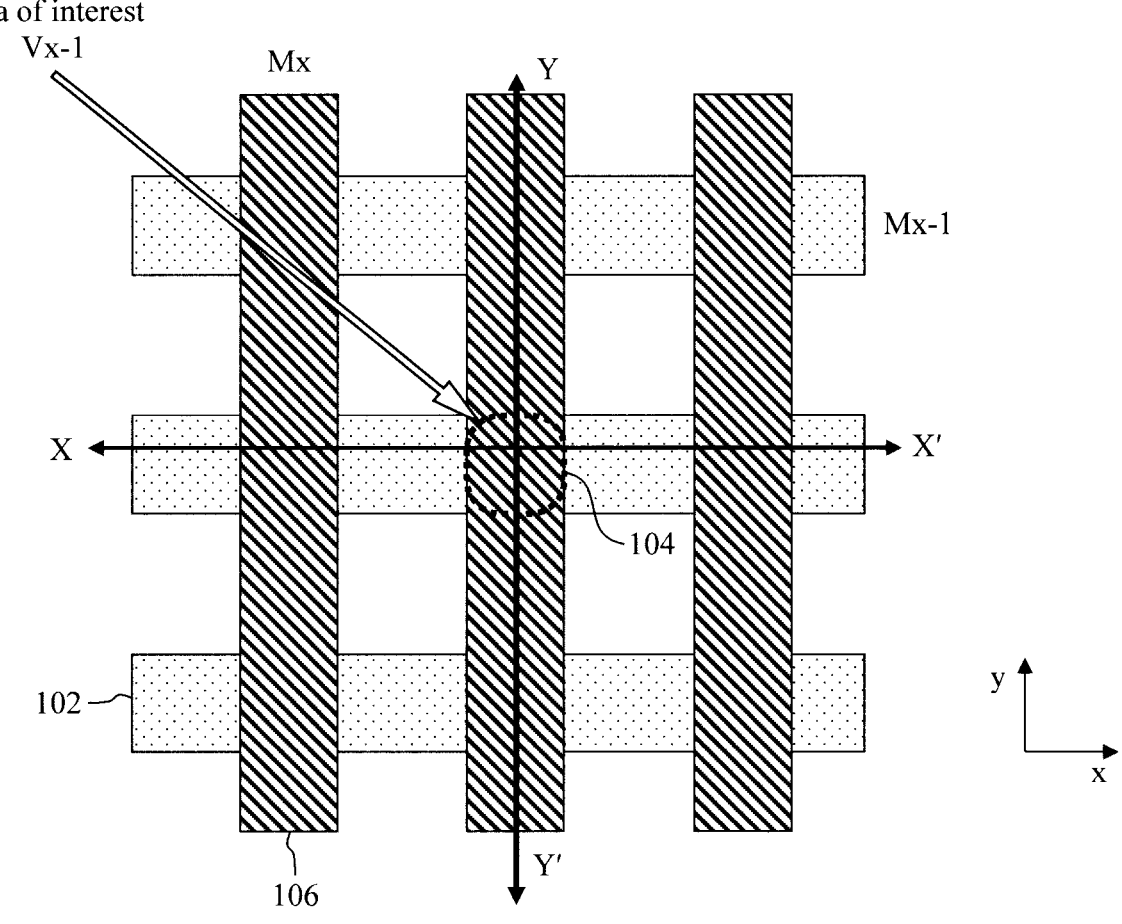
FIG. 2 is a top-down diagram illustrating an orientation of the X-X' and Y-Y' cross-sectional views shown in the figures according to an embodiment of the present invention.

Given the above overview, an exemplary method for fabricating the present interconnect structure with locally increased via size is now described by way of reference to FIGS. 2-12. FIG. 2 is a top-down diagram illustrating an orientation of the cross-sectional views that will be shown in the figures that follow. As shown in FIG. 2, the present process will involve the formation of at least one first metal line 102 (Mx) and at least second metal line 106 (Mx-1) below and above, conductive via 104 (Vx-1 labeled 'Via of interest'), respectively. The first metal lines 102 extend along a first direction (x-direction) and the second metal lines 106 extend along a second (y-direction) that are perpendicular to one another. Thus, in this example, the first metal lines 102 are oriented orthogonal the second metal lines 106. As described in conjunction with the description of FIG. 1 above, the first direction (x-direction) is along a major axis a1 of the first metal lines 102, and the second direction (y-direction) is along a major axis a2 of the second metal lines 106. Conductive via 104 is present at the intersection of one of the first metal lines 102 and one of the second metal lines 106.

The positioning of conductive via 104 is depicted using dotted lines in FIG. 2 since conductive via 104 is obscured by the corresponding second metal line 106 in a top-down view. Further, as will be described in detail below, there are interlayer dielectrics and dielectric caps above and/or below the first/second metal lines 102 and 106. However, these components are not shown in FIG. 2 in order to illustrate the orientation of the cross-sectional views with respect to first metal lines 102, second metal lines 106 and conductive via 104.

As shown in FIG. 2, the X-X' cross-sectional views that will be shown in the figures that follow depict cuts along the major axis a1 of the first metal line 102 below conductive via 104 and through each of the second metal lines 106 above conductive via 104. Notably, the X-X' cross-sectional views depict cuts along the minor axes b2 of each of the second metal lines 106 (see description of FIG. 1 above). The Y-Y' cross-sectional views that will be shown in the figures that follow depict cuts along the major axis a2 of the second metal line 106 above conductive via 104 and through each of the first metal lines 102 below conductive via 104. Notably, the Y-Y' cross-sectional views depict cuts along the minor axes b1 of each of the first metal lines 102 (see description of FIG. 1 above).

Figures 3A, 3B:
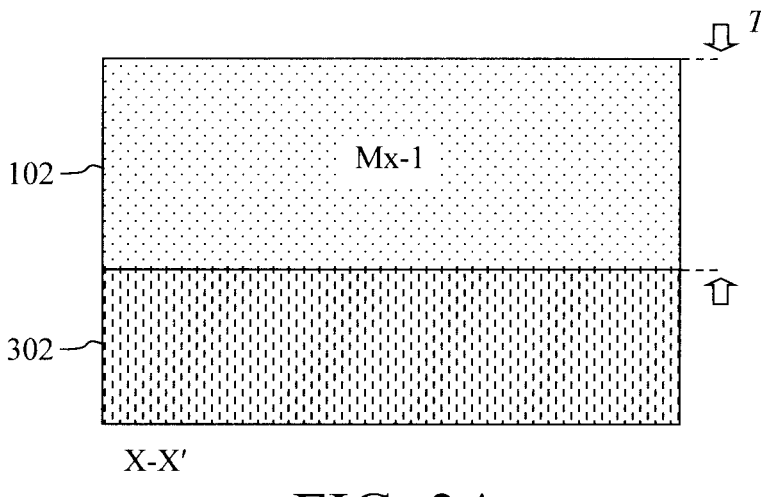
FIG. 3A is an X-X' cross-sectional view illustrating first metal lines (Mx-1) having been formed on a substrate.
FIG. 3B is a Y-Y' cross-sectional view illustrating the first metal lines (Mx-1), which are embedded in a (first) interlayer dielectric, having been formed on the substrate according to an embodiment of the present invention.
Figure 4A:
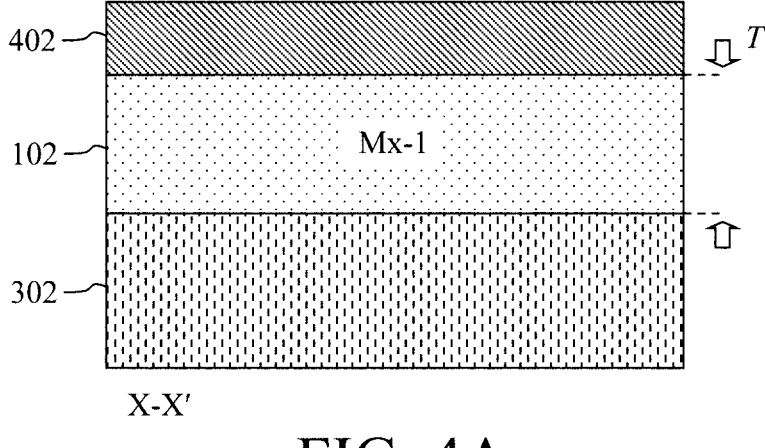
FIG. 4A is an X-X' cross-sectional view illustrating (first) dielectric caps having been formed on each of the first metal lines.
Figure 4B:
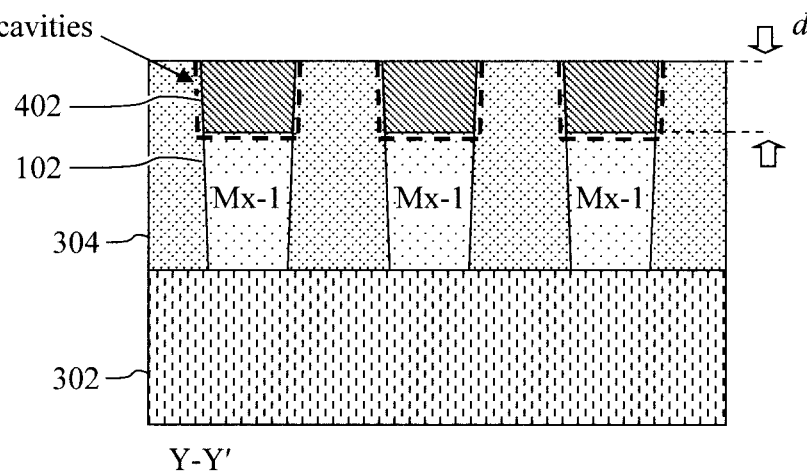
FIG. 4B is a Y-Y' cross-sectional view illustrating the first dielectric caps having been formed on each of the first metal lines according to an embodiment of the present invention.

As shown in FIG. 3A (an X-X' cross-sectional view) and FIG. 3B (a Y-Y' cross-sectional view), the process begins with the formation of the first metal lines 102 (Mx-1) on a substrate 302. It is notable that, while the present example involves the formation of three first metal lines 102 and three second metal lines 106 as described below, the number of first and second metal lines 102 and 106 can vary from what is shown in the figures. In the same manner, while the present example involves the formation of a single conductive via 104, the number of conductive vias 104 can vary from what is shown in the figures, including embodiments which are contemplated herein where multiple conductive vias 104 are formed.

According to an exemplary embodiment, substrate 302 is a bulk semiconductor wafer, such as a bulk silicon (Si), bulk germanium (Ge), bulk silicon germanium (SiGe) and/or bulk III-V semiconductor wafer. Alternatively, substrate 302 can be a semiconductor-on-insulator (SOI) wafer. A SOI wafer includes a SOI layer separated from an underlying substrate by a buried insulator. When the buried insulator is an oxide it is also referred to herein as a buried oxide or BOX. The SOI layer can include any suitable semiconductor material(s), such as Si, Ge, SiGe and/or a III-V semiconductor. Further, substrate 302 may already have pre-built structures (not shown) such as transistors, diodes, capacitors, resistors, interconnects, wiring, etc.

A so-called damascene metallization process can be employed to form the first metal lines 102 on substrate 302. For instance, according to an exemplary embodiment, an interlayer dielectric 304 is first deposited onto the substrate 302. See FIG. 3B in particular. Suitable interlayer dielectric 304 materials include, but are not limited to, oxide materials such as SiOx and/or organosilicate glass (SiCOH) and/or ultralow-K interlayer dielectric (ULK-ILD) materials, e.g., having a dielectric constant κ of less than 2.7. Suitable ultralow-κ dielectric materials include, but are not limited to, porous organosilicate glass (pSiCOH). A process such as chemical vapor deposition (CVD), atomic layer deposition (ALD), or physical vapor deposition (PVD) can be used to deposit the interlayer dielectric 304. Following deposition, the interlayer dielectric 304 can be planarized using a process such as chemical-mechanical polishing. According to an exemplary embodiment, interlayer dielectric 304 has a thickness of from about 5 nm to about 200 nm.

A standard lithography and etching process is next employed to pattern trenches in the interlayer dielectric 304, which are then filled with a metal or combination of metals to form the first metal lines 102 embedded in the interlayer dielectric 304. With standard lithography and etching techniques, a lithographic stack (not shown), e.g., photoresist/anti-reflective coating/organic planarizing layer, is used to pattern a hardmask (not shown) with the footprint and location of each of the trenches (outlining each of the first metal lines 102) to be patterned in the interlayer dielectric 304. An etch is then performed to transfer the pattern from the hardmask to the underlying interlayer dielectric 304.

Suitable metals for first metal lines 102 include, but are not limited to, copper (Cu), tungsten (W), ruthenium (Ru) and/or cobalt (Co), which can be deposited into the trenches using a process such as evaporation, sputtering, ALD, CVD or electrochemical plating. Following deposition, the metal overburden can be removed using a process such as chemical-mechanical polishing. Prior to depositing the metal(s), an adhesion layer (not shown) can be formed lining the trenches. Suitable adhesion layer materials include, but are not limited to, titanium nitride (TiN) and/or tantalum nitride (TaN). Additionally, a seed layer (not shown) can also be deposited into and lining the trenches prior to metal deposition, e.g., to facilitate plating of the metal. As shown, for example, in FIG. 3B, according to one exemplary embodiment, the top surfaces of the first metal lines 102 are made coplanar with a top surface of the interlayer dielectric 304 at this stage in the process.

However, the next task is to form a dielectric cap 402 directly on each of the first metal lines 102. See FIG. 4A (an X-X' cross-sectional view) and FIG. 4B (a Y-Y' cross-sectional view). To do so, the first metal lines 102 are first recessed below the top surface of the interlayer dielectric 304. This recessing of the first metal lines 102 is easily detectable in FIG. 4B. However, comparing FIG. 3A and FIG. 4A, it can be seen that a thickness T of the first metal lines 102 (FIG. 3A) has a reduced thickness T' (FIG. 4A) following the recess, i.e., where T' is less than T (T'<7). A selective metal etch such as a metal-selective wet chemical etch or selective dry etch can be employed to recess the first metal lines 102 relative to the interlayer dielectric 304.

Recessing of the first metal lines 102 relative to the interlayer dielectric 304 creates cavities (outlining each of the dielectric caps 402) in the interlayer dielectric 304 over the first metal lines 102. See, for example, FIG. 4a According to an exemplary embodiment, the first metal lines 102 are recessed to a depth d relative to a top surface of the interlayer dielectric 304 of from about 3 nm to about 50 nm. A dielectric material is then deposited into, and filling, the cavities to form the dielectric caps 402 on each of the first metal lines 102. Suitable materials for dielectric caps 402 include, but are not limited to, silicon nitride (SiN), silicon carbide (SiC), silicon dioxide (SiO$_2$), silicon oxycarbide (SiCO), aluminum nitride (AlNx) and/or aluminum oxide (AlOx), which can be deposited into the cavities and over the first metal lines 102 using a process such as CVD, ALD or PVD. Following deposition, the dielectric material can be planarized using a process such as chemical-mechanical polishing. As shown, for example, in FIG. 4B, according to one exemplary embodiment, the dielectric caps 402 are polished down to the interlayer dielectric 304 such that the top surfaces of the dielectric caps 402 are coplanar with a top surface of the interlayer dielectric 304. Thus, like the first metal lines 102, the dielectric caps 402 are also embedded in the interlayer dielectric 304. Polishing the dielectric caps 402 down to the interlayer dielectric 304 provides a flat surface for processing the next layer of the structure.

Figure 5A:
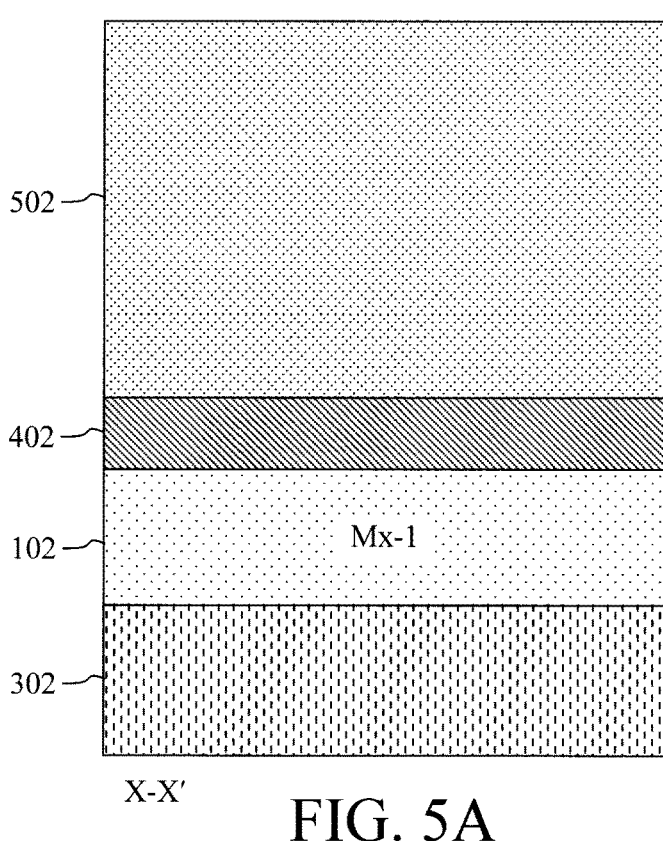
FIG. 5A is an X-X' cross-sectional view illustrating a (second) interlayer dielectric having been deposited onto the first interlayer dielectric over the first metal lines and the first dielectric caps.
Figure 5B:
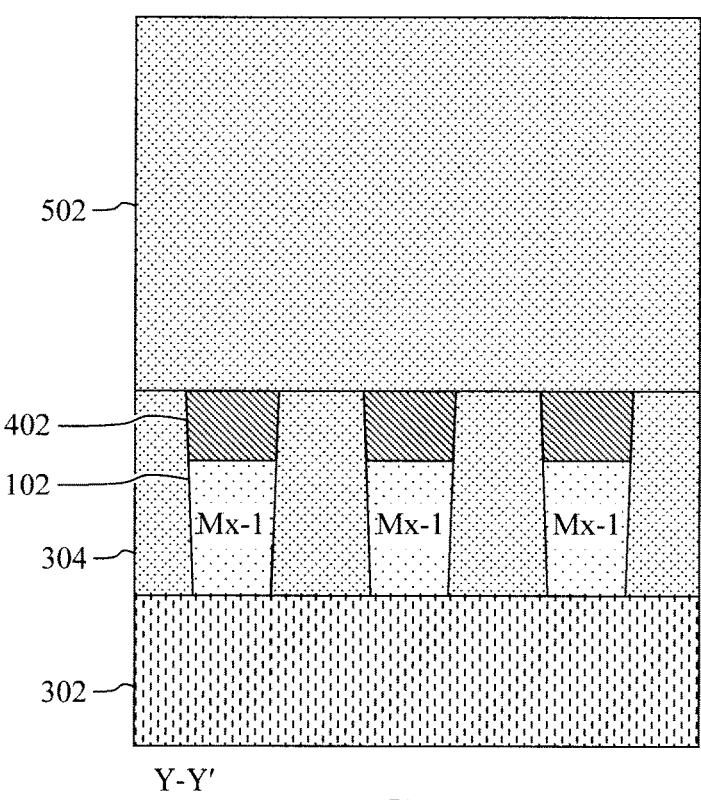
FIG. 5B is a Y-Y' cross-sectional view illustrating the second interlayer dielectric having been deposited onto the first interlayer dielectric over the first metal lines and the first dielectric caps according to an embodiment of the present invention.

Namely, as shown in FIG. 5A (an X-X' cross-sectional view) and FIG. 5B (a Y-Y' cross-sectional view), an interlayer dielectric 502 is next deposited onto the interlayer dielectric 304 over the first metal lines 102 and dielectric caps 402. For clarity, the terms 'first' and 'second' may also be used herein when referring to interlayer dielectric 304 and interlayer dielectric 502, respectively. Suitable interlayer dielectric 502 materials include, but are not limited to, oxide materials such as SiOx and/or SiCOH and/or ULK-ILD materials such as pSiCOH. A process such as CVD, ALD, or PVD can be used to deposit the interlayer dielectric 502. Following deposition, the interlayer dielectric 502 can be planarized using a process such as chemical-mechanical polishing. According to an exemplary embodiment, interlayer dielectric 502 has a thickness of from about 10 nm to about 300 nm. As will be described in detail below, conductive via 104 will be built in interlayer dielectric 502 with a lateral etch of the dielectric caps being leveraged to locally increase the size of the conductive via 104.

Figure 6A:
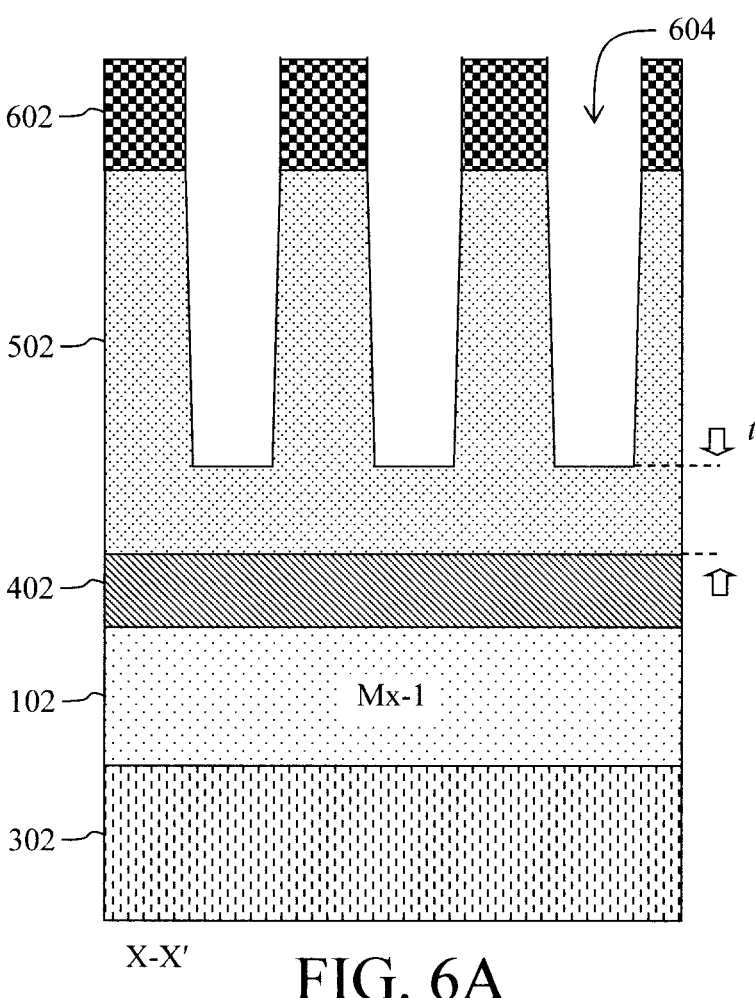
FIG. 6A is an X-X' cross-sectional view illustrating trenches having been formed in the second interlayer dielectric using a hardmask.
Figure 6B:
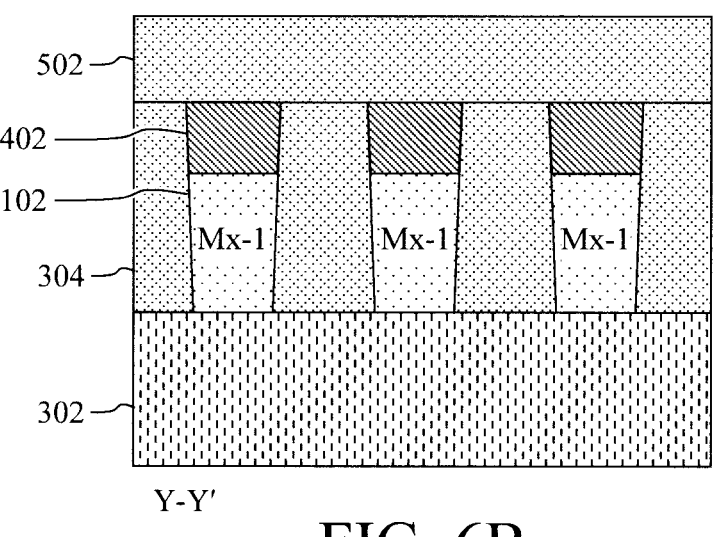
FIG. 6B is a Y-Y' cross-sectional view illustrating the trenches having been formed in the second interlayer dielectric according to an embodiment of the present invention.

Namely, as shown in FIG. 6A (an X-X' cross-sectional view) and FIG. 6B (a Y-Y' cross-sectional view), a patterned hardmask 602 is formed on interlayer dielectric 502, and standard lithography and etching techniques (see above) are used to transfer the pattern from hardmask 602 to the interlayer dielectric 502 thereby forming trenches 604 in interlayer dielectric 502. Suitable hardmask 602 materials include, but are not limited to, silicon nitride (SiN) and/or silicon dioxide (SiO$_2$), titanium nitride (TiN) and/or silicon oxynitride (SiON). An anisotropic etching process such as reactive ion etching can be employed to transfer the pattern from hardmask 602 to the underlying interlayer dielectric 502 forming the trenches 604 in interlayer dielectric 502.

As shown in FIGS. 6A and 6B, this etch of interlayer dielectric 502 is endpointed before the trenches 604 reach the dielectric caps 402. To look at it another way, a portion of the interlayer dielectric 502 remains separating the bottom of the trenches 604 from the dielectric caps 402. As will be described in detail below, this configuration enables the structure to be elongated at the top and bottom of the conductive via 104 in order to locally increase its size. According to an exemplary embodiment, the portion of the interlayer dielectric 502 that remains separating the bottom of the trenches 604 from the dielectric caps 402 has a thickness t of from about 1 nm to about 5 nm.

Figure 7A:
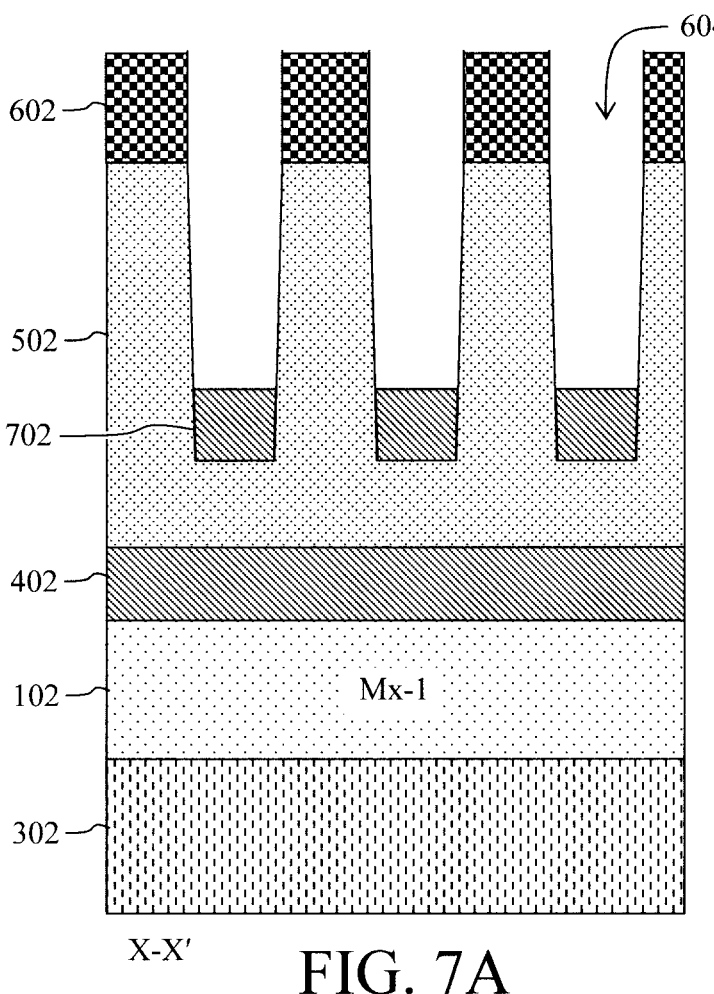
FIG. 7A is an X-X' cross-sectional view illustrating (second) dielectric caps having been formed at the bottoms of the trenches.
Figure 7B:
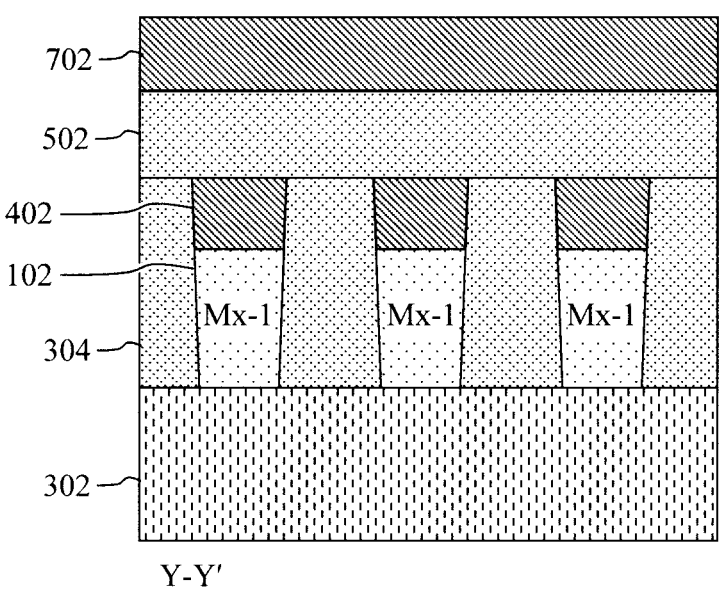
FIG. 7B is a Y-Y' cross-sectional view illustrating the second dielectric caps having been formed at the bottoms of the trenches according to an embodiment of the present invention.

As shown in FIG. 7A (an X-X' cross-sectional view) and FIG. 7B (a Y-Y' cross-sectional view), dielectric caps 702 are next formed at the bottoms of the trenches 604. For clarity, the terms 'first' and 'second' may also be used herein when referring to dielectric caps 402 and dielectric caps 702, respectively. According to an exemplary embodiment, dielectric caps 702 are formed by depositing a dielectric material into and filling the trenches 604, removing the excess dielectric material using a process such as chemical-mechanical polishing, and then recessing the dielectric material selective to the interlayer dielectric 502 to form the dielectric caps 702 at the bottoms of the trenches 604. Suitable materials for dielectric caps 702 include, but are not limited to, SiN, SiC, SiO$_2$, SiCO, AlNx, and/or AlOx, which can be deposited into the trenches 604 using a process such as CVD, ALD or PVD. According to an exemplary embodiment, dielectric caps 402 and dielectric caps 702 each have a thickness of from about 3 nm to about 50 nm.

Recessing of the dielectric cap 702 material relative to the interlayer dielectric 502 can be achieved using a selective etching process. For instance, by way of example only, if the interlayer dielectric 502 is formed from an oxide material (see above), and the dielectric caps 702 are formed from a nitride material, then a nitride-selective etch can be employed to recess the dielectric caps 702 selective to the interlayer dielectric 502.

Further, it is preferable that the dielectric caps 702 are formed from the same material as the dielectric caps 402. Namely, as will become apparent from the description that follows, dielectric caps 402 and dielectric caps 702 are positioned at the top and bottom portions of the conductive via 104, respectively. Thus, use of the same material for dielectric caps 402 and dielectric caps 702 will enable elongation of the top and bottom portions of the conductive via 104 in a single etch step.

Figure 8A:
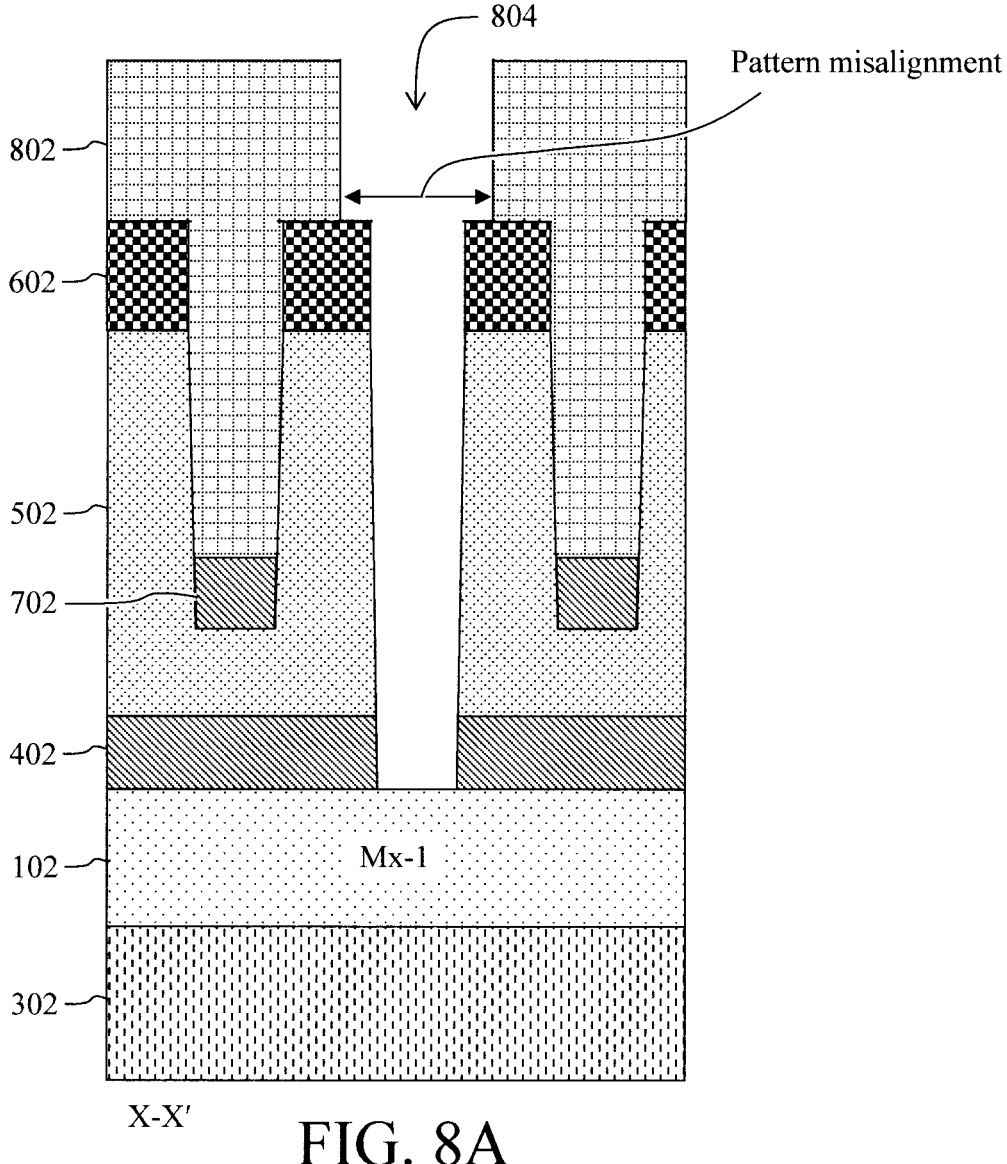
FIG. 8A is an X-X' cross-sectional view illustrating a fill material having been deposited into the trenches, and a via having been patterned through the fill material in a given one of the trenches, and through the underlying second dielectric cap, second interlayer dielectric and first dielectric cap.
Figure 8B:
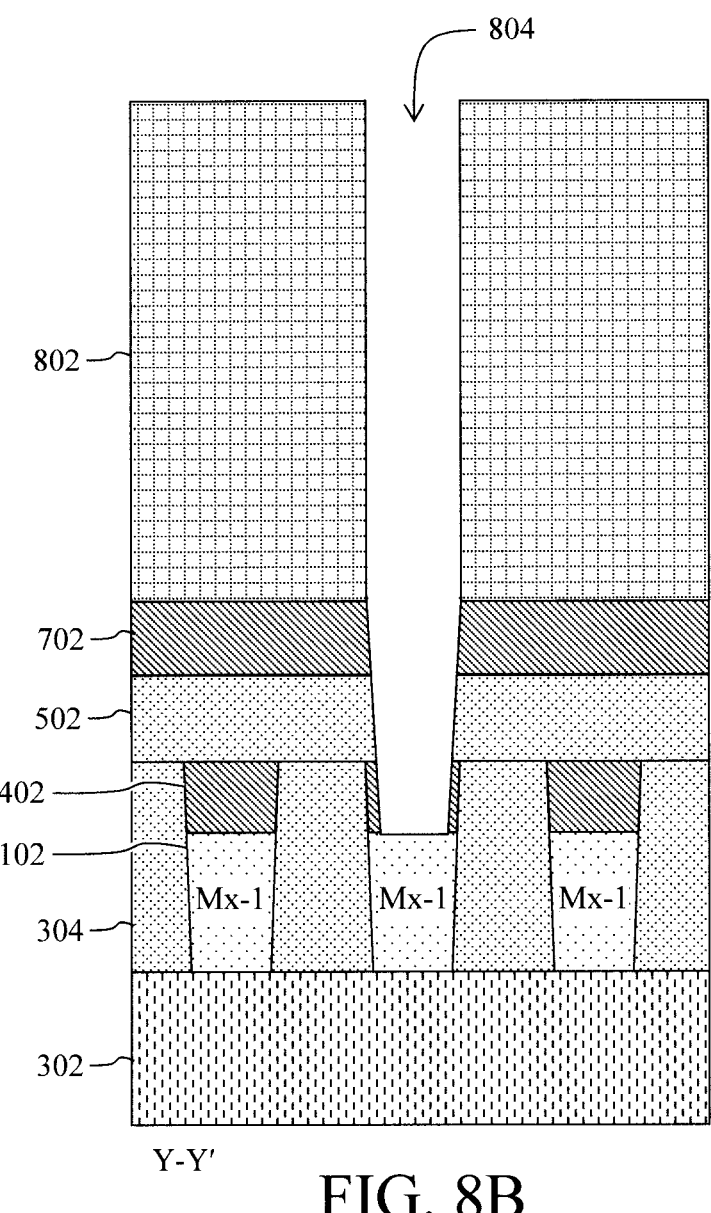
FIG. 8B is a Y-Y' cross-sectional view illustrating the fill material having been deposited into the trenches, and the via having been patterned through the fill material in the given trench, and through the underlying second dielectric cap, second interlayer dielectric and first dielectric cap according to an embodiment of the present invention.

As shown in FIG. 8A (an X-X' cross-sectional view) and FIG. 8B (a Y-Y' cross-sectional view), the next task is to pattern a via 804 through a given one of the dielectric caps 702, through the underlying interlayer dielectric 502 and dielectric cap 402, over a given one of the first metal lines 102. To do so, a fill material 802 is first deposited into and filling the trenches 604 over the dielectric caps 702. Suitable fill materials 802 include, but are not limited to, organic planarizing layer materials, which can be deposited into the trenches 604 using a casting process such as spray coating or spin casting. As shown in FIG. 8A, the fill material 802 can overfill the trenches 604 such that a portion of the fill material 802 is present on top of the hardmask 602.

Fill material 802 is used to protect all but a given one of the trenches 604 through which conductive via 104 will be formed. Namely, as shown in FIGS. 8A and 8B, standard lithography and etching techniques (see above) are next employed to pattern via 804 through the fill material 802 in a given one of the trenches 604 (e.g., the center trench 604 in this example), and through the underlying dielectric cap 702, interlayer dielectric 502 and dielectric cap 402, down to one of the first metal lines 102 (e.g., the center first metal line 102 in this example). A directional, i.e., anisotropic etching process such as reactive ion etching can be employed for the via etch.

Advantageously, given the present structure, via 804 is self-aligned to the corresponding trench 604. Namely, even if the pattern in fill material 802 is not fully aligned with that of the hardmask 602, the positioning of the hardmask 602 will ensure that the patterned via 804 is aligned with the corresponding trench 604. This process is what is referred to herein as 'self-aligned' via patterning. For instance, in the example shown in FIG. 8A, the opening in fill material 802 is wider than the pattern of the hardmask 602 over the trenches 604. This misalignment is, however, inconsequential since the underlying hardmask 602 defines the opening of the trench 604 for the via patterning.

Figure 9A:
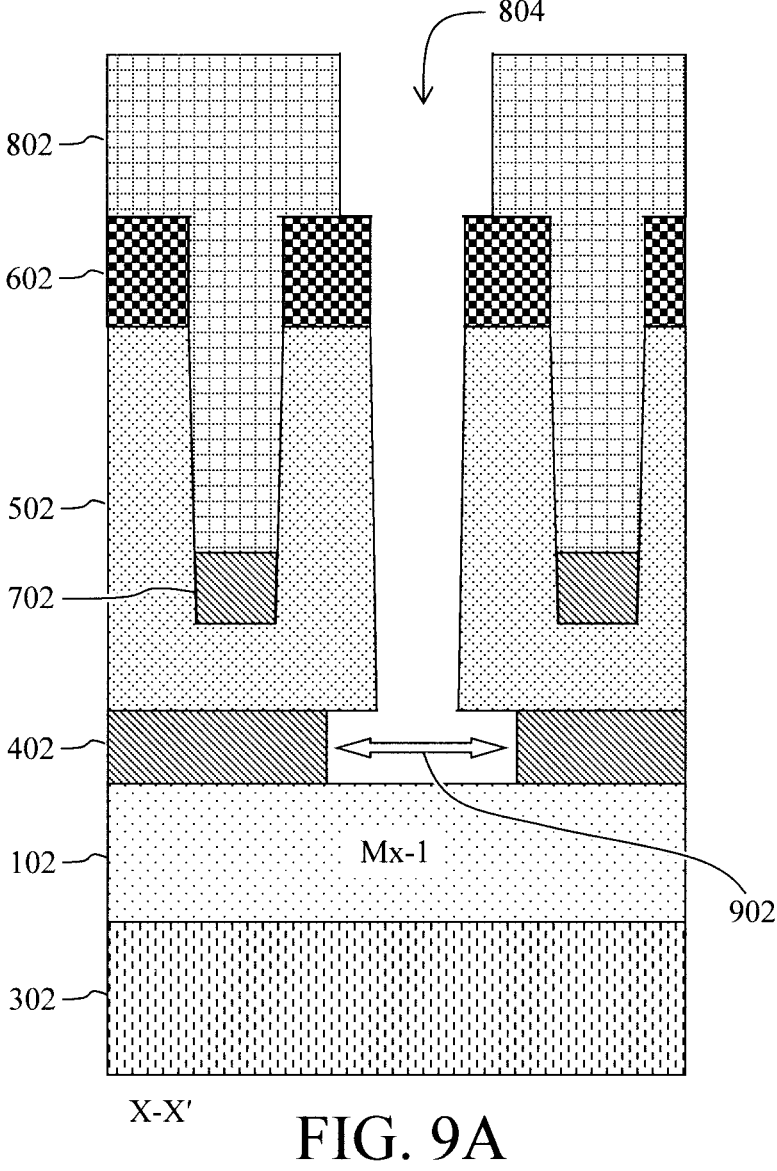
FIG. 9A is an X-X' cross-sectional view illustrating a selective etch having been performed through the via to laterally recess the first/second dielectric caps exposed along the sidewalls of the via in an x-direction.

The given first metal line 102 is now exposed at the bottom of the via 804. Also exposed are the underlying dielectric caps 402 and 702 along the sidewalls of the via 804. As shown in FIG. 9A (an X-X' cross-sectional view) and FIG. 9B (a Y-Y' cross-sectional view), a selective etch performed through the via 804 is then used to laterally recess the given dielectric caps 402 and 702 along the sidewalls of the via 804. Doing so locally elongates the bottom and top dimensions of the via 804. See arrows 902 and 904, respectively. For instance, a non-directional, i.e., isotropic, etching process such as a wet chemical etch can be employed to recess the dielectric caps 402 and 702. The etch chemistry employed should be selective for etching the dielectric cap material relative to the surrounding interlayer dielectrics 304 and 502. For instance, by way of example only, if the interlayer dielectrics 304 and 502 are formed from an oxide material (see above), and the dielectric caps 402 and 702 are formed from a nitride material (see above), then a nitride-selective wet etch can be employed through the via 804 to laterally recess the dielectric caps 402 and 702 selective to the interlayer dielectrics 304 and 502. Further, as provided above, dielectric caps 402 and 702 are preferably formed from the same material. In that case, the lateral recess of the dielectric caps 402 and 702 can be easily performed using a single etch step.

Figure 9B:
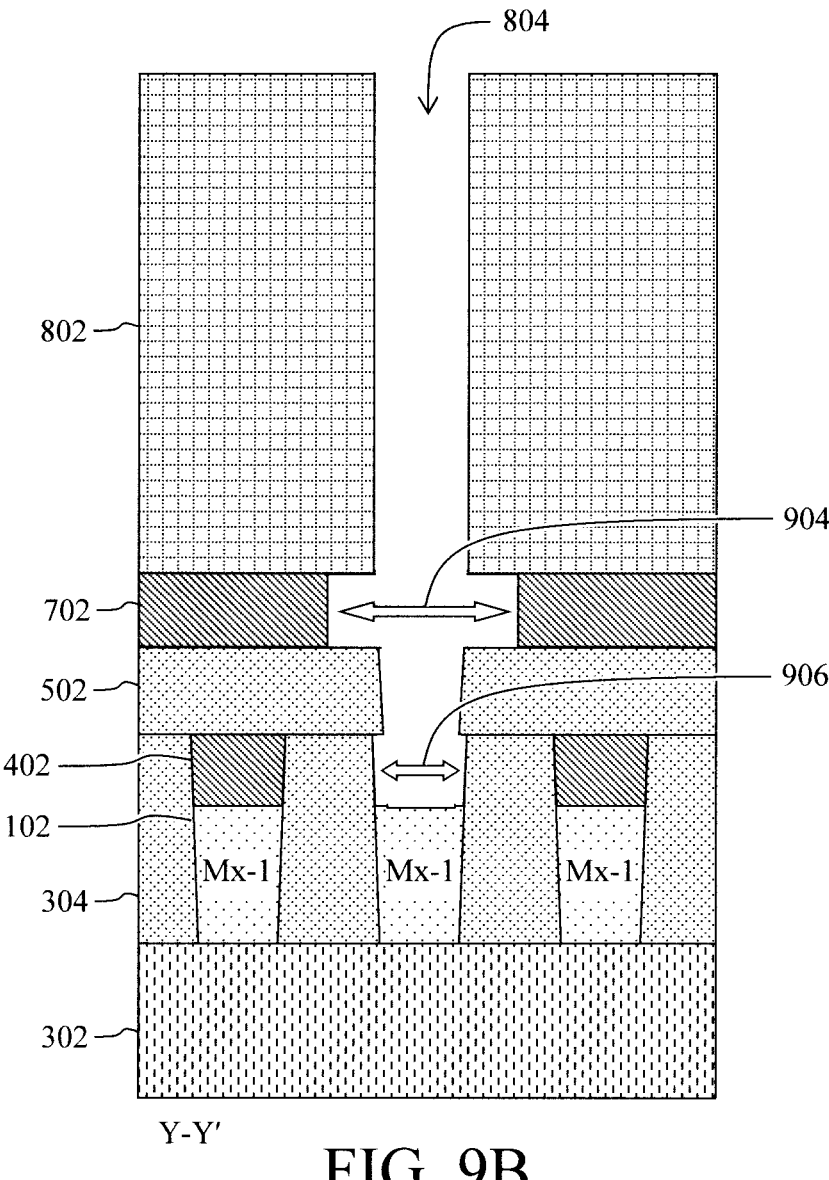
FIG. 9B is a Y-Y' cross-sectional view illustrating the selective etch having been performed through the via to laterally recess the first/second dielectric caps exposed along the sidewalls of the via in a y-direction according to an embodiment of the present invention.

Thus, as shown in FIG. 9A, the dielectric cap 402 over the given first metal line 102 is now laterally recessed along the x-direction. As described in conjunction with the description of FIG. 1 above, in the present example the x-direction is along the major axis of the first metal lines 102. In the same manner, as shown in FIG. 9B, the dielectric cap 702 below the corresponding second metal line 106 (to be formed below) is now laterally recessed along the y-direction. As described in conjunction with the description of FIG. 1 above, in the present example the y-direction is along the major axis of the second metal lines 106. As shown in FIG. 9B, some recessing of the dielectric cap 402 can also occur in the y-direction (see arrow 906). However, the surrounding interlayer dielectric 304 confines that lateral expansion to the dimensions of the minor axis of the given first metal line 102.

Figure 10A:
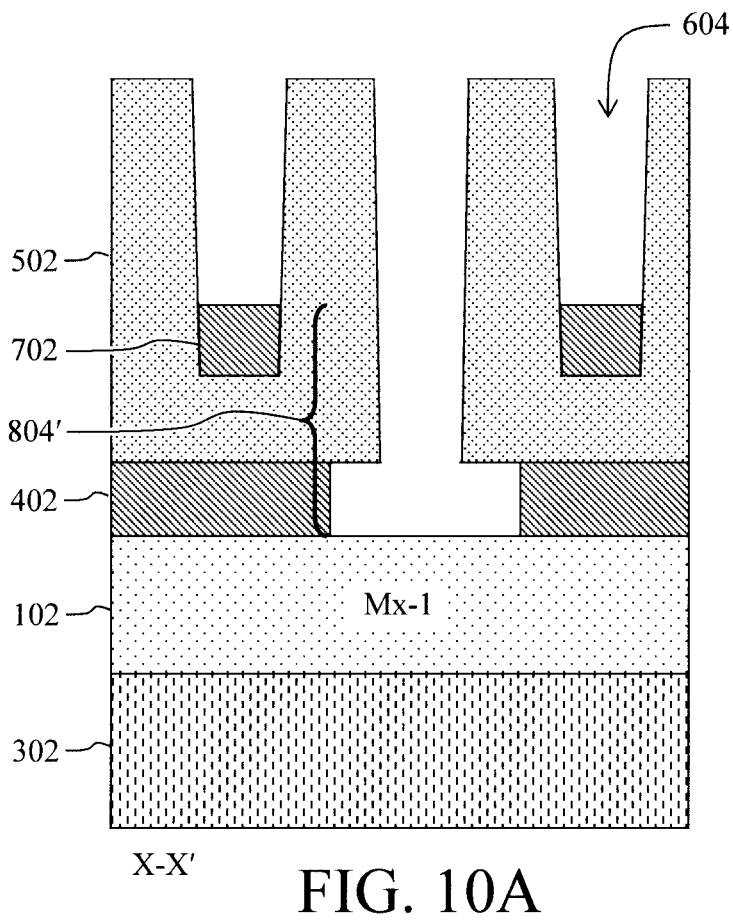
FIG. 10A is an X-X' cross-sectional view illustrating the fill material and hardmask having been removed to reopen the trenches.
Figure 10B:
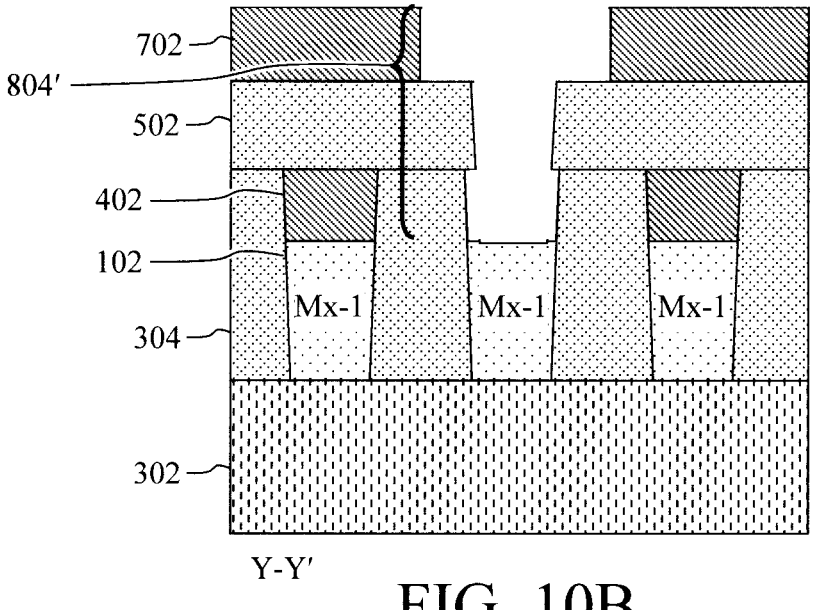
FIG. 10B is a Y-Y' cross-sectional view illustrating the fill material and hardmask having been removed to reopen the trenches according to an embodiment of the present invention.

As shown in FIG. 10A (an X-X' cross-sectional view) and FIG. 10B (a Y-Y' cross-sectional view), following the lateral recess etch the fill material 802 and hardmask 602 are removed. By way of example only, as provided above, the fill material 802 can be an organic planarizing layer material. In that case, the fill material 802 can be removed using an ashing process. After that, the hardmask 602 can be removed by selective wet or dry etch. Removal of the fill material 802 reopens the trenches 604. What remains of the (now locally elongated) via 804 is now present in the given dielectric caps 402 and 702 and interlayer dielectric 502 therebetween which, for clarity, moving forward is given the reference numeral 804'. See FIGS. and 10B. Reopening the trenches 604 will permit the second metal lines 106 to be formed over the dielectric caps 702 and via 804'/conductive via 104, as described in detail below.

Figure 11A:
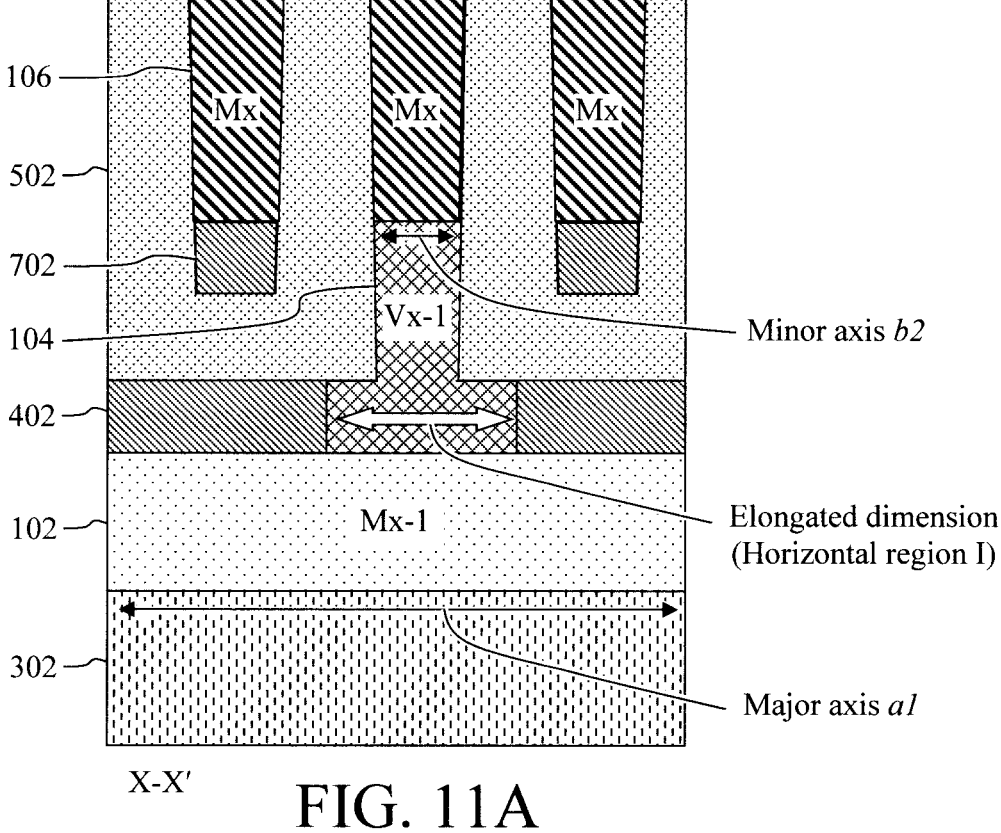
FIG. 11A is an X-X' cross-sectional view illustrating a conductive via having been formed in the via directly contacting a given one of the first metal lines, and second metal lines having been formed in the trenches with a given one of the second metal lines being present over the conductive via.
Figure 11B:
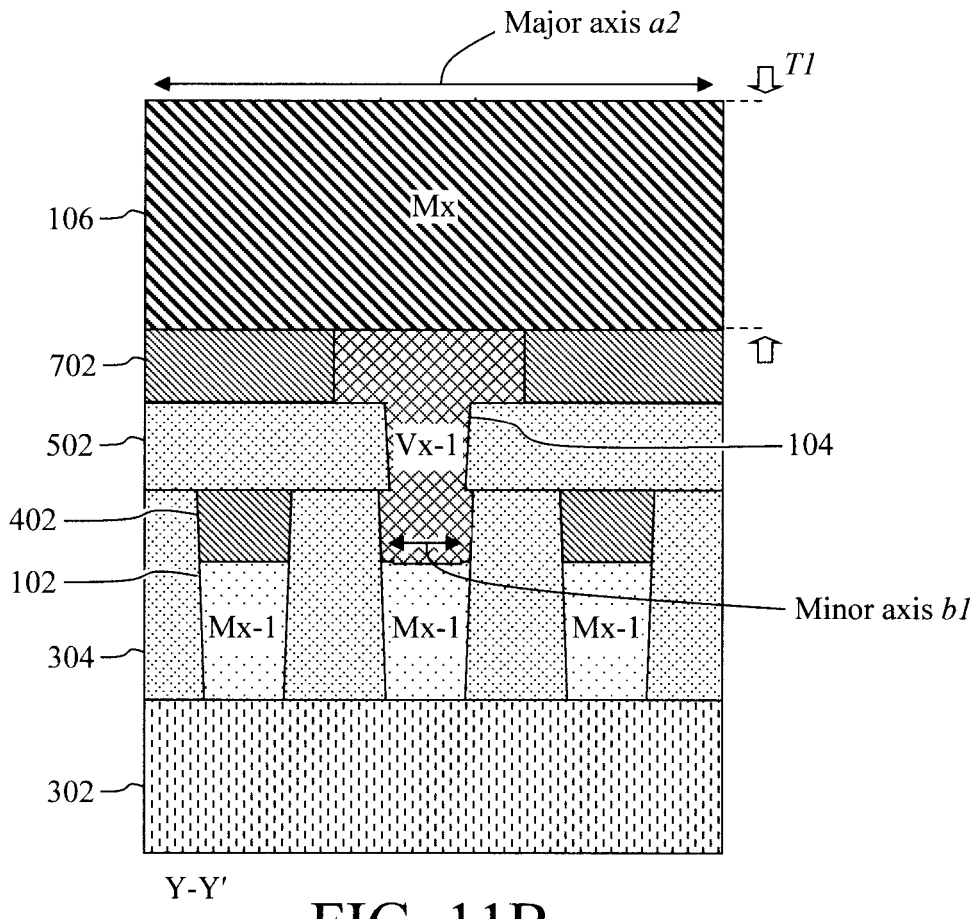
FIG. 11B is a Y-Y' cross-sectional view illustrating the conductive via having been formed in the via directly contacting the given first metal line, and the second metal lines having been formed in the trenches with the given second metal line being present over the conductive via according to an embodiment of the present invention.

Namely, as shown in FIG. 11A (an X-X' cross-sectional view) and FIG. 11B (a Y-Y' cross-sectional view), conductive via 104 (Vx-1) is next formed in via 804' directly contacting the given first metal line 102, and second metal lines 106 (Mx) are formed in the trenches 604 directly on the dielectric caps 702. Notably, a given one of the second metal lines 106 (in this example the center second metal line 106) is present over, and directly contacts the conductive via 104.

The conductive via 104 and the second metal lines 106 can be formed in a number of different ways. For instance, according to one exemplary embodiment, the conductive via 104 and the second metal lines 106 are formed together using a single step metal fill. In that case, by way of example only, an adhesion layer (not shown) is first deposited into and lining the trenches 604 and via 804'. Suitable adhesion layer materials include, but are not limited to, TiN and/or TaN. A metal or combination of metals is then deposited into the trenches 604 and via 804' to form, in one metal deposition step, the conductive via 104 and the second metal lines 106. Suitable metals include, but are not limited to, Cu, Ru and/or Co which can be deposited into the trenches 604 and via 804' using a process such as evaporation, sputtering, ALD, CVD or electrochemical plating. Following deposition, the metal overburden can be removed using a process such as chemical-mechanical polishing. By way of this single step metal fill process, the conductive via 104 and the second metal lines 106 will be formed from the same metal or combination of metals.

According to another exemplary embodiment, the conductive via 104 and the second metal lines 106 are formed using two separate steps. For instance, the conductive via 104 is formed first using a bottom-up selective metal growth in the via 804'. The second metal lines 106 are then formed over the conductive via 104 by a metal fill into the trenches 604. By way of example only, a bottom-up selective growth of a metal(s) such as tungsten (W), Co and/or Ru can be used to form the conductive via 104 in the via 804'. A metal or combination of metals such as Cu, Ru and/or Co is then deposited into the trenches 604 over the conductive via 104. A process such as evaporation, sputtering, ALD, CVD or electrochemical plating can be employed to deposit the metal(s) into the trenches 604 over the conductive via 104. Following deposition, the metal overburden can be removed using a process such as chemical-mechanical polishing. While the conductive via 104 and the second metal lines 106 can be formed from the same metal or combination of metals, with this two-step process the composition of the conductive via 104 can also be different from that of the second metal lines 106. For instance, the conductive via 104 can contain a different metal or combination of metals from the second metal lines 106.

As shown in FIGS. 11A and 11B, the above-described lateral recessing of the dielectric caps 402 and 702 exposed along the sidewalls of the via 804' gives the resulting conductive via 104 its unique shape and configuration. For instance, referring to FIG. 11A, in the x-direction conductive via 104 has an elongated dimension along the major axis (referred to as major axis a1 in FIG. 1 above) of the corresponding first metal line 102 (referred to as Horizontal region I in FIG. 1 above). However, in the y-direction conductive via 104 has substantially the same dimension as the corresponding second metal line 106 along a minor axis (referred to as minor axis b2 in FIG. 1 above) of that second metal line 106. According to an exemplary embodiment, the first metal lines 102 are oriented orthogonal to the second metal lines 106.

Referring to FIG. 11B, in the y-direction conductive via 104 has an elongated dimension along the major axis (referred to as major axis a2 in FIG. 1 above) of the corresponding second metal line 106 (referred to as Horizontal region II in FIG. 1 above). However, in the y-direction conductive via 104 has substantially the same dimension as the corresponding first metal line 102 along a minor axis of that first metal line 102 (referred to as minor axis b1 in FIG. 1 above).

Figure 12A:
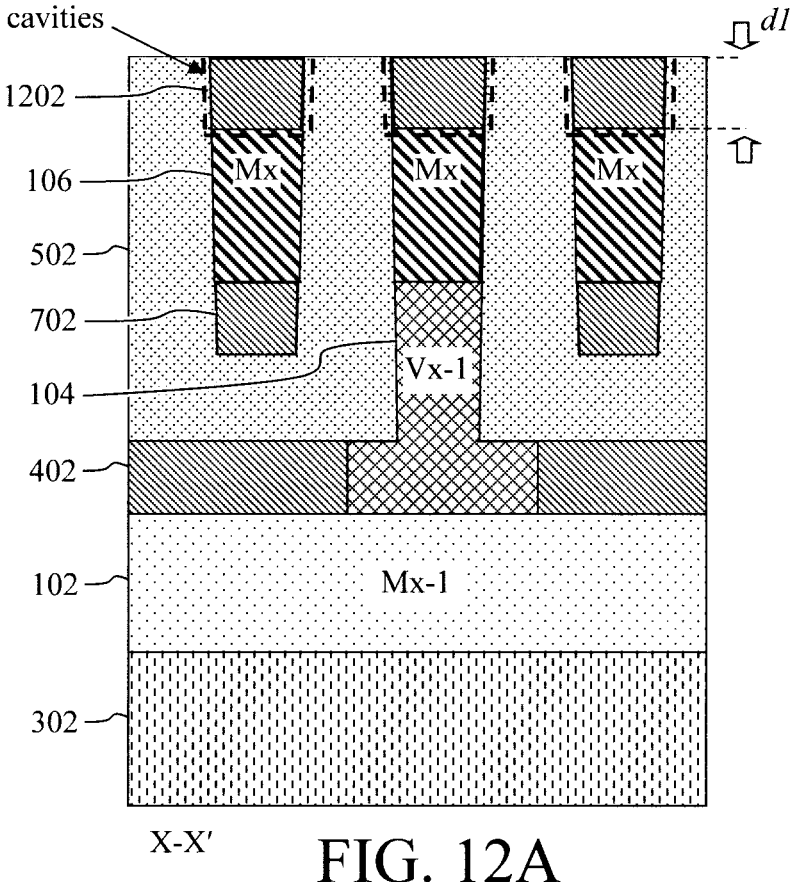
FIG. 12A is an X-X' cross-sectional view illustrating (third) dielectric caps having been formed directly on the second metal lines.
Figure 12B:
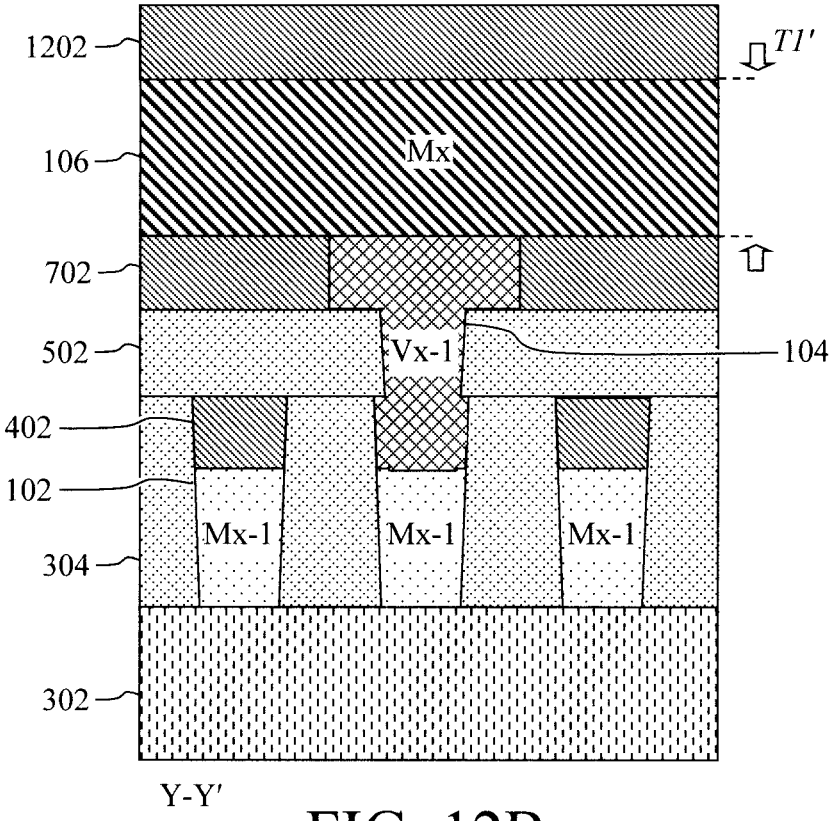
FIG. 12B is a Y-Y' cross-sectional view illustrating the third dielectric caps having been formed directly on the second metal lines according to an embodiment of the present invention.

As shown in FIG. 12A (an X-X' cross-sectional view) and FIG. 12B (a Y-Y' cross-sectional view), dielectric caps 1202 are then formed directly on each of the second metal lines 106. For clarity, the term 'third' may also be used herein when referring to dielectric caps 1202 in order to distinguish them from the 'first' dielectric caps 402 and the 'second' dielectric caps 702. To form dielectric caps 1202, the second metal lines 106 are first recessed below the top surface of the interlayer dielectric 502. This recessing of the second metal lines 106 is easily detectable in FIG. 12A. However, comparing FIG. 11B and FIG. 12B, it can be seen that a thickness T1 of the second metal lines 106 (FIG. 11B) has a reduced thickness T1' (FIG. 12B) following the recess, i.e., where T1' is less than T1 (T1'<T1). A selective metal etch such as a metal-selective wet chemical etch can be employed to recess the second metal lines 106 relative to the interlayer dielectric 502.

Recessing of the second metal lines 106 relative to the interlayer dielectric 502 creates cavities (outlining each of the dielectric caps 1202) in the interlayer dielectric 502 over the second metal lines 106. See, for example, FIG. 12A. According to an exemplary embodiment, the second metal lines 106 are recessed to a depth d1 relative to a top surface of the interlayer dielectric 502 of from about 3 nm to about 50 nm. A dielectric material is then deposited into, and filling, the cavities to form the dielectric caps 1202 on each of the second metal lines 106. Suitable materials for dielectric caps 1202 include, but are not limited to, SiN, SiC, SiO$_2$, SiCO, AlNx, and/or AlOx, which can be deposited into the cavities and over the second metal lines 106 using a process such as CVD, ALD or PVD. As provided above, dielectric caps 402 and 702 are preferably formed from the same material or the same combination of materials. While this is not a requirement for the dielectric caps 1202, embodiments are contemplated herein where all of the dielectric caps, i.e., dielectric caps 402, 702 and 1202, are formed from the same material or the same combination of materials. In the alternative, dielectric caps 1202 can be formed from a different material or a different combination of materials than dielectric caps 402 and 702. Following deposition, the dielectric material can be planarized using a process such as chemical-mechanical polishing. As shown, for example, in FIG. 12A, according to one exemplary embodiment, the dielectric caps 1202 are polished down to the interlayer dielectric 502 such that the top surfaces of the dielectric caps 1202 are coplanar with a top surface of the interlayer dielectric 502. Thus, both the second metal lines 106 and the dielectric caps 1202 are embedded in the interlayer dielectric 502.

Thus, as shown in FIGS. 12A and 12B, the present interconnect structure includes the first metal lines 102 and dielectric caps 402 disposed directly on the first metal lines 102. The conductive via 104 is disposed directly on a given one of the first metal lines 102 (e.g., the center first metal line 102 in the present example). The second metal lines 106 are present over (and oriented orthogonal to) the first metal lines 102, with a given one of the second metal lines 106 (e.g., the center second metal line 106 in the present example) disposed directly on the conductive via 104. As described in detail above, the conductive via 104 has elongated dimensions along a major axis a1 of the given first metal line and along a major axis a2 of the given second metal line. Notably, dielectric caps 702 and 1202 are present below and above the second metal lines 106.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. An interconnect structure, comprising:
   at least a first metal line and a second metal line; and
   a conductive via in between the first metal line and the second metal line, wherein the conductive via has a first elongated dimension along a major axis of the first metal line and the conductive via has a second elongated dimension along a major axis of the second metal line, wherein the conductive via has a vertical shaft that connects the first elongated dimension and the second elongated dimension, wherein the major axis of the first metal line and the major axis of the second metal line are perpendicular to each other, wherein the first elongated dimension extends outwards from the vertical shaft in two directions along the first major axis of the first metal line to form a T-shape, wherein the second elongated dimension extends outwards from the vertical shaft in two directions along the second major axis of the second metal line to form an inverted T-shape.

2. The interconnect structure of claim 1, wherein the conductive via has substantially a same dimension as the first metal line along a minor axis of the first metal line, and wherein the conductive via has substantially a same dimension as the second metal line along a minor axis of the second metal line.

3. The interconnect structure of claim 1, wherein the first metal line is oriented orthogonal to the second metal line.

4. The interconnect structure of claim 1, wherein the first metal line is present below the conductive via and the second metal line is present above the conductive via, and wherein the interconnect structure further comprises:
   dielectric caps both below and above the second metal line.

5. The interconnect structure of claim 4, wherein the dielectric caps each comprises a material selected from the group consisting of: silicon nitride (SiN), silicon carbide (SiC), silicon dioxide (SiO2), silicon oxycarbide (SiCO), aluminum nitride (AlNx), aluminum oxide (AlOx) and combinations thereof.

6. An interconnect structure, comprising:
   first metal lines;
   first dielectric caps on the first metal lines;
   a conductive via disposed directly on a given one of the first metal lines;
   second metal lines over the first metal lines with a given one of the second metal lines disposed directly on the conductive via, wherein the conductive via has a first elongated dimension along a major axis of the given first metal line and the conductive via has a second elongated dimension along a major axis of the given second metal line, wherein the conductive via has a vertical shaft that connects the first elongated dimension and the second elongated dimension, wherein the major axis of the first metal line and the major axis of the second metal line are perpendicular to each other, wherein the first elongated dimension extends outwards from the vertical shaft in two directions along the first major axis of the first metal line to form a T-shape, wherein the second elongated dimension extends outwards from the vertical shaft in two directions along the second major axis of the second metal line to form an inverted T-shape;

second dielectric caps present below the second metal lines; and third dielectric caps present above the second metal lines.

7. The interconnect structure of claim 6, wherein the conductive via has substantially a same dimension as the given first metal line along a minor axis of the given first metal line, and wherein the conductive via has substantially a same dimension as the given second metal line along a minor axis of the given second metal line.

8. The interconnect structure of claim 6, wherein the first metal lines are oriented orthogonal to the second metal lines.

9. The interconnect structure of claim 6, wherein the first metal lines and the first dielectric caps are embedded in a first interlayer dielectric.

10. The interconnect structure of claim 9, wherein the second metal lines, the second dielectric caps and the third dielectric caps are embedded in a second interlayer dielectric.

11. The interconnect structure of claim 6, wherein the first dielectric caps, the second dielectric caps and the third dielectric caps each comprises a material selected from the group consisting of: SiN, SiC, SiO2, SiCO, AlNx, AlOx and combinations thereof.

* * * * *